(12) United States Patent
Yang et al.

(10) Patent No.: US 6,180,489 B1
(45) Date of Patent: Jan. 30, 2001

(54) FORMATION OF FINELY CONTROLLED SHALLOW TRENCH ISOLATION FOR ULSI PROCESS

(75) Inventors: Fu-Liang Yang, Tainan; Bih-Tiao Lin, Ping-Tung; Wei-Ray Lin, Taipei; Erik S. Jeng, Hsinchu, all of (TW)

(73) Assignee: Vanguard International Semiconductor Corporation

( * ) Notice: Under 35 U.S.C. 154(b), the term of this patent shall be extended for 0 days.

(21) Appl. No.: 09/290,922

(22) Filed: Apr. 12, 1999

(51) Int. Cl.$^7$ .................................................. H01L 21/76
(52) U.S. Cl. ............................ 438/424; 438/296; 438/427
(58) Field of Search ...................................... 438/296, 424, 438/427

(56) References Cited

U.S. PATENT DOCUMENTS

| | | | |
|---|---|---|---|
| 4,962,064 | 10/1990 | Haskell et al. | 437/228 |
| 5,492,858 | 2/1996 | Bose et al. | 437/67 |
| 5,494,857 | 2/1996 | Cooperman et al. | 437/228 |
| 5,641,704 | 6/1997 | Paoli et al. | 438/436 |
| 5,663,107 | 9/1997 | Peschke et al. | 438/692 |
| 5,719,085 * | 2/1998 | Moon et al. | 438/424 |
| 5,728,621 * | 3/1998 | Zheng et al. | 438/427 |
| 5,780,346 * | 7/1998 | Arghavani et al. | 438/296 |
| 5,817,567 * | 10/1998 | Jang et al. | 438/427 |
| 5,872,043 * | 2/1999 | Chen | 438/424 |
| 5,923,993 * | 7/1999 | Sahota | 438/427 |
| 6,033,970 * | 3/2000 | Park | 438/435 |
| 6,048,771 * | 4/2000 | Lin et al. | 438/296 |
| 6,048,775 * | 4/2000 | Yao et al. | 438/427 |
| 6,057,210 * | 5/2000 | Yang et al. | 438/427 |
| 6,071,792 * | 6/2000 | Kim et al. | 438/424 |

\* cited by examiner

*Primary Examiner*—Charles Bowers
*Assistant Examiner*—David S Blum
(74) *Attorney, Agent, or Firm*—George O. Saile; Stephen B. Ackerman; Rosemary L. S. Pike

(57) ABSTRACT

A method for forming planarized shallow trench isolation is described. A nitride layer is deposited over the surface of a semiconductor substrate. A plurality of isolation trenches are etched through the nitride layer into the semiconductor substrate wherein there are at least one wide trench and at least one narrow trench. A first oxide layer is deposited over the first nitride layer and within the isolation trenches wherein the first oxide layer fills the isolation trenches. A capping nitride layer is deposited overlying the first oxide layer. A second oxide layer is deposited overlying the capping nitride layer. The second oxide layer is polished away wherein the second oxide layer and the capping nitride layer are left only within the wide trench. The first and second oxide layers are dry etched away with an etch stop on the capping nitride layer within the wide trench and the first nitride layer wherein the second oxide layer is completely removed. Thereafter, the first oxide layer is overetched to leave the top surface of the first oxide layer just above the bottom surface of the first nitride layer and the capping nitride layer within the wide trench. The capping nitride layer and the first nitride layer are removed completing the formation of shallow trench isolation regions in the fabrication of an integrated circuit device.

20 Claims, 6 Drawing Sheets

FORMATION OF FINELY CONTROLLED SHALLOW TRENCH ISOLATION FOR ULSI PROCESS

BACKGROUND OF THE INVENTION (1) Field of the Invention

The present invention relates to the fabrication of integrated circuit devices, and more particularly, to a method of forming planarized shallow trench isolation in the fabrication of integrated circuits.

(2) Description of the Prior Art

Shallow trench isolation (STI) is widely used to provide isolation between active areas, especially in ultra large scale integrated (ULSI) circuit devices. To achieve good planarity after STI, chemical mechanical polishing (CMP) is often used. However, due to pad deformation, the trench open area is susceptible to dishing which causes oxide thinning in the wide trench.

FIG. 1 illustrates a partially completed integrated circuit device of the prior art. A silicon nitride layer 14 has been deposited over the surface of a semiconductor substrate 10. Trenches in the substrate have been filled with an oxide 17. Referring to FIG. 2, the oxide 17 is polished using CMP. Oxide dishing and the resulting lack of oxide uniformity can both be seen in area 19.

A number of workers in the art have sought to avoid these problems. U.S. Pat. No. 4,962,064 to Haskell et al teaches the use of a polysilicon layer over the oxide trench fill material. The oxide material is then planarized with a series of alternating CMP and dry or wet etches including at least two of each. U.S. Pat. No. 5,494,857 to Cooperman et al teaches CMP of shallow trenches using a reverse-tone mask to form oxide blocks in the wide trenches and a silicon nitride polish stop layer. U.S. Pat. No. 5,641,704 to Paoli et al discloses filling trenches with a first conformal oxide, a planarizing oxide, and then a second conformal oxide. The fill material is planarized by chemical etching the active areas through a mask, then CMP, followed by chemical etching with an etch stop at the silicon nitride layer. U.S. Pat. No. 5,492,858 to Bose et al shows a silicon nitride liner deposited in the trench before the oxide filler. The oxide is then steam annealed, followed by a resist etchback step and CMP. U.S. Pat. No. 5,663,107 to Peschke et al uses a doped glass as a fill material with silicon nitride thereover. Planarization includes CMP, isotropic etch back, dry etching to remove the nitride, and a second CMP step.

SUMMARY OF THE INVENTION

Accordingly, the primary object of the invention is to provide a process for forming planarized shallow trench isolation in the fabrication of integrated circuits.

A further object of the invention is to provide a process for forming planarized shallow trench isolation in which oxide dishing is eliminated.

Still another object is to provide a process for forming planarized shallow trench isolation in which remaining oxide thickness is easily controlled.

Yet another object of the invention is to provide a process for forming planarized shallow trench isolation comprising chemical mechanical polishing followed by dry etching.

In accordance with the objects of the invention, a method for forming planarized shallow trench isolation is achieved. A nitride layer is deposited over the surface of a semiconductor substrate. A plurality of isolation trenches are etched through the nitride layer into the semiconductor substrate wherein there are at least one wide trench and at least one narrow trench. A first oxide layer is deposited over the first nitride layer and within the isolation trenches wherein the first oxide layer fills the isolation trenches. A capping nitride layer is deposited overlying the first oxide layer. A second oxide layer is deposited overlying the capping nitride layer. The second oxide layer is polished away wherein the second oxide layer and the capping nitride layer are left only within the wide trench. The first and second oxide layers are dry etched away with an etch stop on the capping nitride layer within the wide trench and the first nitride layer wherein the second oxide layer is completely removed. Thereafter, the first oxide layer is overetched to leave the top surface of the first oxide layer just above the bottom surface of the first nitride layer and the capping nitride layer within the wide trench. The capping nitride layer and the first nitride layer are removed completing the formation of shallow trench isolation regions in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
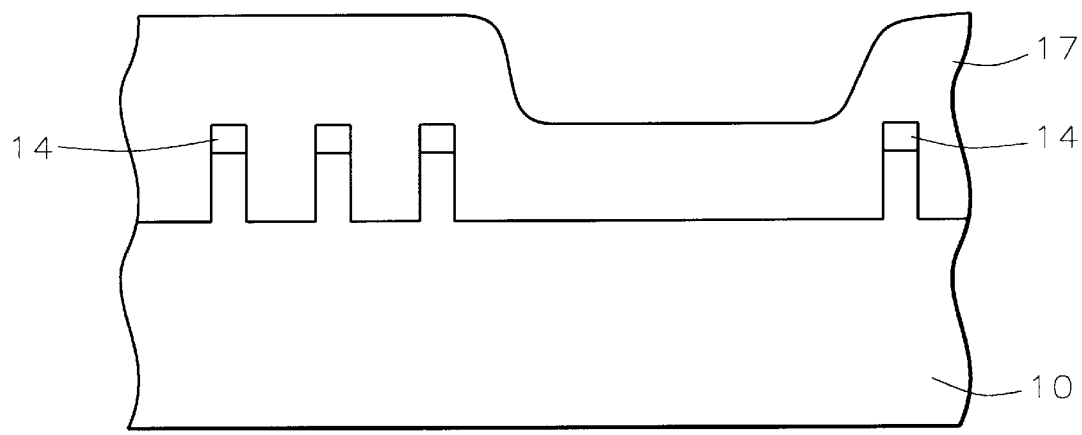
FIGS. 1 and 2 are cross-sectional representations of an embodiment of the prior art.
Figure 2:
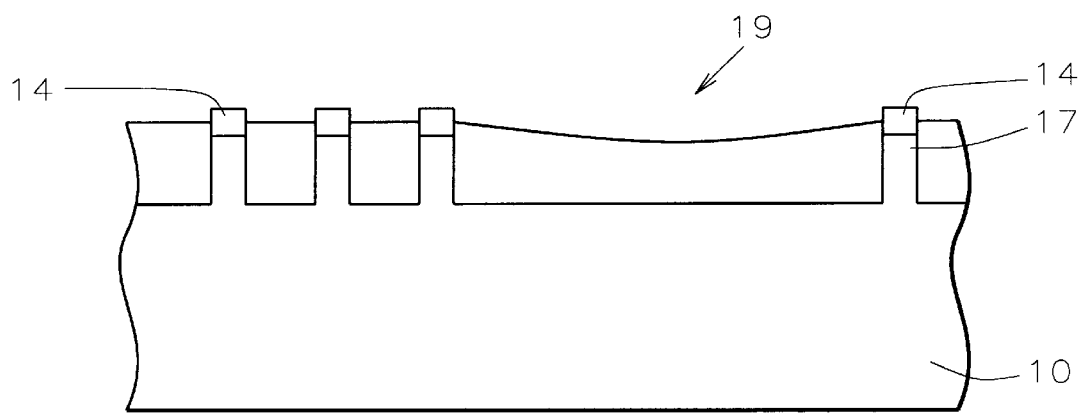
Figure 3:
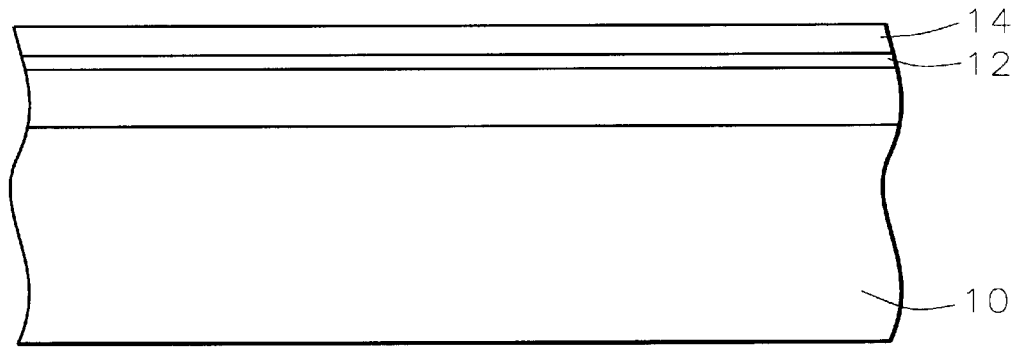
FIGS. 3 through 10 are cross-sectional representations of a preferred embodiment of the present invention.

Referring now more particularly to FIG. 3, there is shown a semiconductor substrate 10. A layer of pad silicon oxide 12 is grown on the surface of the semiconductor substrate to a thickness of between about 50 and 250 Angstroms. A layer of silicon nitride 14 is deposited over the pad oxide layer 12 to a thickness of between about 500 and 2500 Angstroms.

Figure 4:
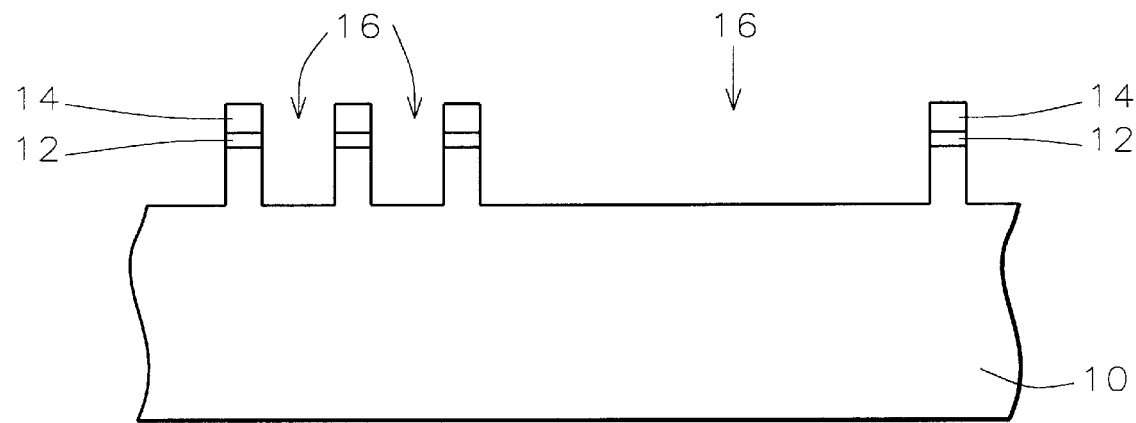

Referring now to FIG. 4, shallow trenches are etched into the silicon substrate using conventional photolithography and etching techniques. The shallow trenches 16 are etched to a depth of between about 2500 and 5000 Angstroms into the semiconductor substrate.

Figure 5:
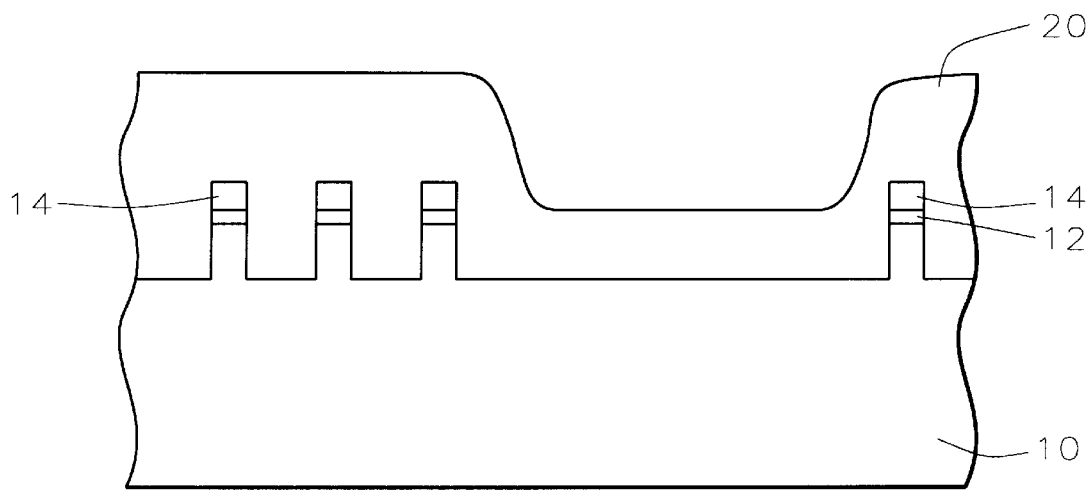

Next, as illustrated in FIG. 5, a silicon oxide layer 20 is deposited by chemical vapor deposition (CVD) to a thickness of between about 5000 and 16,000 Angstroms over the surface of the substrate and filling the trenches.

Figure 6:
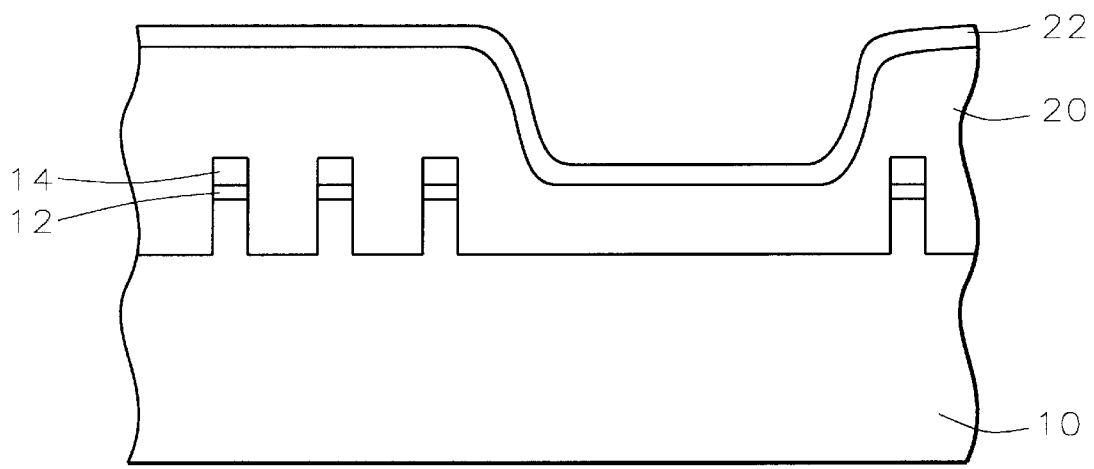

Now, the key features of the present invention will be described. Referring to FIG. 6, a capping silicon nitride layer 22 is deposited conformally over the oxide layer 20 to a thickness of between about 400 and 2000 Angstroms. This layer 22 may be some other material than silicon nitride as long as it can be polished and etched selectively with respect to the silicon oxide layer 20. For example, silicon nitride layer 22 is deposited by CVD or plasma-enhanced CVD.

Figure 7:
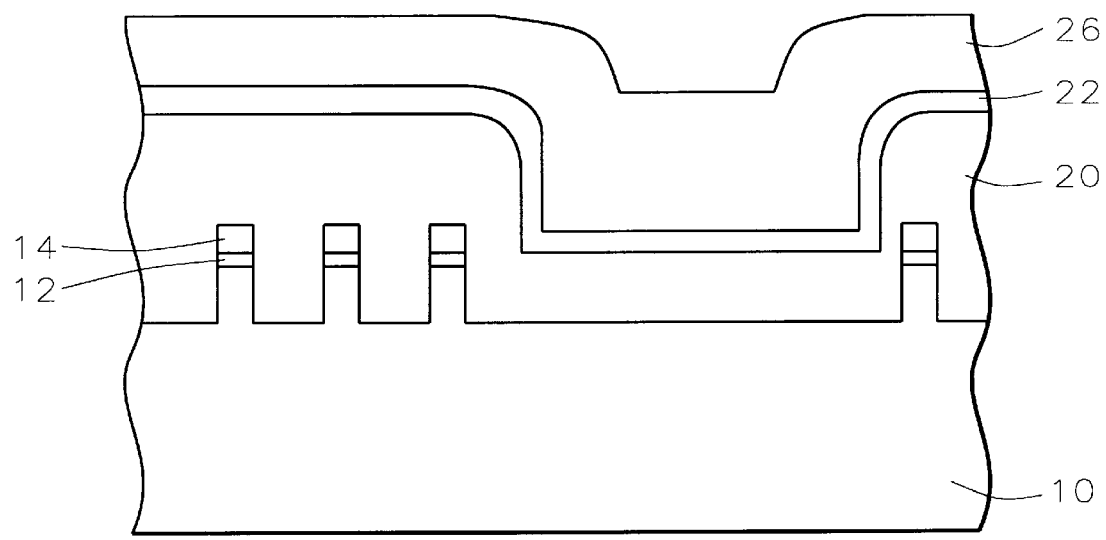

Referring now to FIG. 7, a second silicon oxide layer 26 is deposited by CVD or plasma-enhanced CVD over the capping nitride layer 22 to a thickness of between about 1000 and 5000 Angstroms. The second oxide layer is preferably of the same material as the first oxide layer 20, but may be of a different material.

Figure 8:
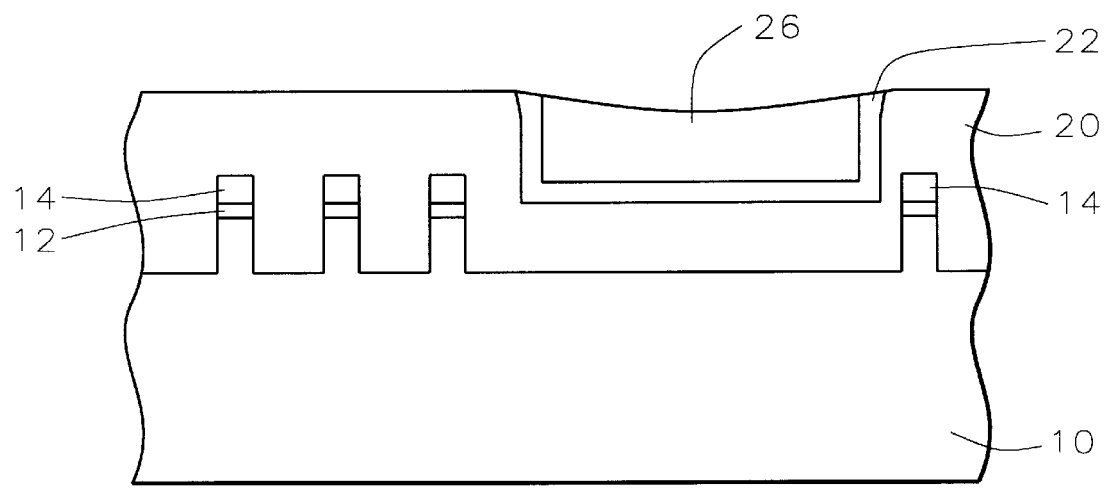

The second oxide layer is now polished using CMP and stopping when the second nitride layer 22 is polished away in the areas over the narrow spaces, as illustrated in FIG. 8.

The CMP step uses time mode control to assure that the second nitride layer 22 remains only within the trench.

Figure 9:
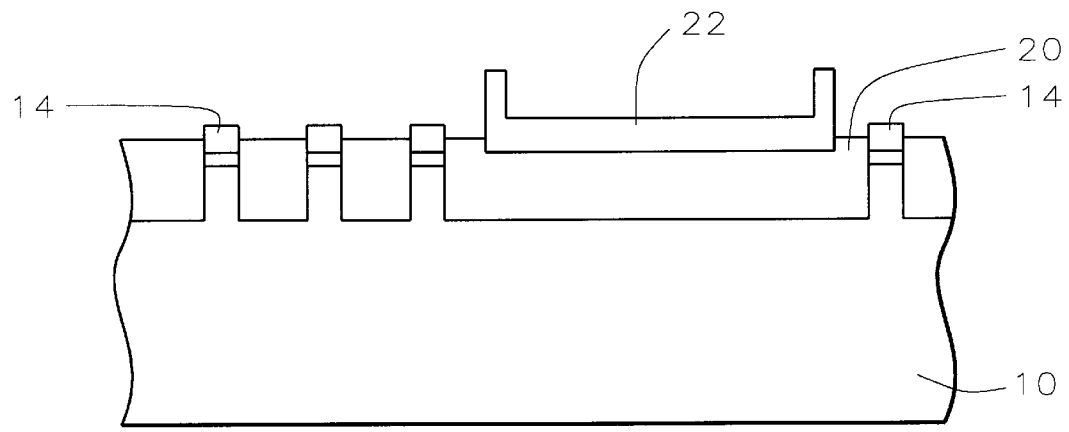

Next, a dry oxide etching is performed with an etch stop at silicon nitride with overetching. This removes all of the second oxide 26 and the first oxide 20 above the top of the first nitride layer 14, as shown in FIG. 9. When the nitride layer 22 is reached, it is overetched by between about 10 and 20% so that all of the oxide 26 overlying the nitride layer 26 is removed. This overetching using an endpoint detector allows the remaining oxide thickness to be controlled easily.

Figure 10:
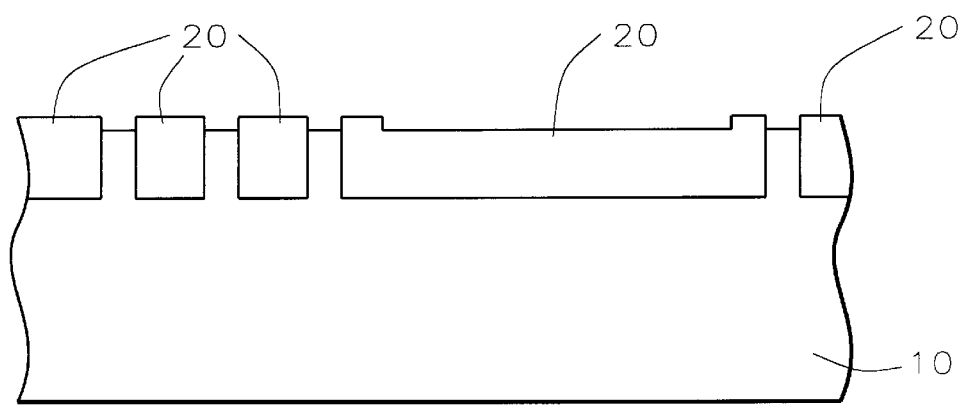

Because of the presence of the second nitride layer 22 over the wide trench, dishing over the wide trench is eliminated. The silicon nitride is removed with a conventional wet etch and the pad oxide is removed completing the formation of the shallow trench isolation, as illustrated in FIG. 10.

Figure 11:
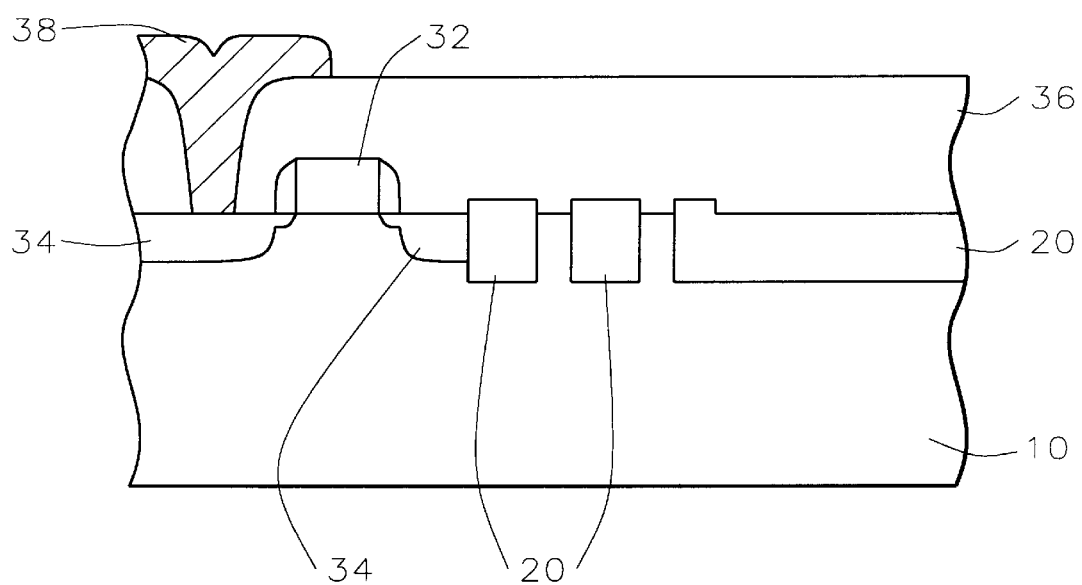
FIG. 11 is a cross-sectional representation of a completed integrated circuit device fabricated by the process of the present invention.

Processing continues as is conventional in the art. For example, semiconductor device structures, including gate electrodes 32 and source and drain regions 34 may be formed as is conventional in the art. Electrical contacts 38 may be made through dielectric isolation layer 36, as shown in FIG. 11.

The process of the present invention results in the formation of planarized shallow trench isolation using a CMP process followed by a dry etching wherein oxide dishing is eliminated. The dry etching, using overetching with endpoint detector, allows the remaining oxide thickness to be controlled easily.

While the invention has been particularly shown and described with reference to the preferred embodiments thereof, it will be understood by those skilled in the art that various changes in form and details may be made without departing from the spirit and scope of the invention.

What is claimed is:

1. A method of planarizing the surface of an integrated circuit device comprising:
   depositing a first nitride layer on the surface of a semiconductor substrate;
   etching a plurality of isolation trenches through said first nitride layer into said semiconductor substrate wherein there is at least one wide trench and at least one narrow trench;
   depositing a first oxide layer over said first nitride layer and within said isolation trenches wherein said first oxide layer fills said isolation trenches;
   depositing a capping nitride layer overlying said first oxide layer;
   depositing a second oxide layer overlying said capping nitride layer;
   polishing away said second oxide layer until said first oxide layer is exposed wherein said second oxide layer and said capping nitride layer are left only within said wide trench;
   dry etching away said first and second oxide layers with an etch stop on said capping nitride layer within said wide trench and said first nitride layer;
   thereafter overetching said first oxide layer to leave the top surface of said first oxide layer just above the bottom surface of said first nitride layer and said capping nitride layer within said wide trench; and
   removing said capping nitride layer and said first nitride layer completing said planarization of said surface of said integrated circuit device.

2. The method according to claim 1 further comprising providing a pad oxide layer underlying said first nitride layer.

3. The method according to claim 1 wherein said first nitride layer comprises silicon nitride and is deposited by chemical vapor deposition to a thickness of between about 500 and 2500 Angstroms.

4. The method according to claim 1 wherein said first oxide layer comprises silicon oxide and is deposited by chemical vapor deposition to a thickness of between about 5000 and 16,000 Angstroms.

5. The method according to claim 1 wherein said capping nitride layer comprises silicon nitride and is deposited by chemical vapor deposition to a thickness of between about 400 and 2000 Angstroms.

6. The method according to claim 1 wherein said capping nitride layer comprises silicon nitride and is deposited by plasma-enhanced chemical vapor deposition to a thickness of between about 400 and 2000 Angstroms.

7. The method according to claim 1 wherein said second oxide layer comprises silicon oxide and is deposited by chemical vapor deposition to a thickness of between about 1000 and 5000 Angstroms.

8. The method according to claim 1 wherein said second oxide layer comprises silicon oxide and is deposited by plasma-enhanced chemical vapor deposition to a thickness of between about 1000 and 5000 Angstroms.

9. The method according to claim 1 wherein said step of polishing away said second oxide layer comprises chemical mechanical polishing (CMP).

10. The method according to claim 1 wherein said isolation trenches comprises shallow trench isolation (STI).

11. The method according to claim 1 further comprising fabricating semiconductor device structures in and on said semiconductor substrate between said isolation trenches.

12. A method of forming shallow trench isolation (STI) regions in the fabrication of an integrated circuit device comprising:
   depositing a pad oxide layer on the surface of a semiconductor substrate;
   depositing a first nitride layer overlying said pad oxide layer;
   etching a plurality of isolation trenches through said first nitride layer and said pad oxide layer into said semiconductor substrate wherein there is at least one wide trench and at least one narrow trench;
   depositing a first oxide layer over said first nitride layer and within said isolation trenches wherein said first oxide layer fills said isolation trenches;
   depositing a capping nitride layer overlying said first oxide layer;
   depositing a second oxide layer overlying said capping nitride layer;
   polishing away said second oxide layer wherein said second oxide layer and said capping nitride layer are left only within said wide trench;
   dry etching away said first and second oxide layers with an etch stop on said capping nitride layer within said wide trench and said first nitride layer wherein said second oxide layer is completely removed;
   thereafter overetching said first oxide layer to leave the top surface of said first oxide layer just above the bottom surface of said first nitride layer and said capping nitride layer within said wide trench; and
   removing said capping nitride layer and said first nitride layer completing said formation of said shallow trench isolation regions in said fabrication of said integrated circuit device.

13. The method according to claim 12 wherein said first nitride layer comprises silicon nitride and is deposited by chemical vapor deposition to a thickness of between about 500 and 2500 Angstroms.

14. The method according to claim 12 wherein said first oxide layer comprises silicon oxide and is deposited by chemical vapor deposition to a thickness of between about 5000 and 16,000 Angstroms.

15. The method according to claim 12 wherein said capping nitride layer has a thickness of between about 400 and 2000 Angstroms.

16. The method according to claim 12 wherein said second oxide layer has a thickness of between about 1000 and 5000 Angstroms.

17. The method according to claim 12 wherein said step of polishing away said second oxide layer comprises chemical mechanical polishing (CMP).

18. The method according to claim 12 wherein said isolation trenches comprises shallow trench isolation (STI) and further comprising fabricating semiconductor device structures in and on said semiconductor substrate between said shallow trench isolation regions.

19. A method of forming shallow trench isolation (STI) regions in the fabrication of an integrated circuit device comprising:

depositing a pad oxide layer on the surface of a semiconductor substrate;

depositing a first nitride layer overlying said pad oxide layer;

etching a plurality of isolation trenches through said first nitride layer and said pad oxide layer into said semiconductor substrate wherein there is at least one wide trench and at least one narrow trench;

depositing a first oxide layer over said first nitride layer and within said isolation trenches wherein said first oxide layer fills said isolation trenches;

depositing a capping nitride layer overlying said first oxide layer;

depositing a second oxide layer overlying said capping nitride layer;

chemical-mechanically polishing away said second oxide layer until said first oxide layer is exposed wherein said second oxide layer and said capping nitride layer are left only within said wide trench;

dry etching away said first and second oxide layers with an etch stop on said capping nitride layer within said wide trench and said first nitride layer wherein said second oxide layer is completely removed;

thereafter overetching said first oxide layer to leave the top surface of said first oxide layer just above the bottom surface of said first nitride layer and to leave said capping nitride layer within said wide trench; and removing said capping nitride layer and said first nitride layer completing said formation of said shallow trench isolation regions in said fabrication of said integrated circuit device.

20. The method according to claim 19 wherein said isolation trenches comprises shallow trench isolation (STI) and further comprising fabricating semiconductor device structures in and on said semiconductor substrate between said shallow trench isolation regions.

* * * * *